(12) United States Patent
Schneider

(10) Patent No.: US 9,006,007 B2
(45) Date of Patent: Apr. 14, 2015

(54) METHOD FOR PRODUCING AN OPTOELECTRONIC ASSEMBLY AND OPTOELECTRONIC ASSEMBLY

(71) Applicant: OSRAM Opto Semiconductors GmbH, Regensburg (DE)

(72) Inventor: Markus Schneider, Schönhofen (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/255,524

(22) Filed: Apr. 17, 2014

(65) Prior Publication Data

US 2014/0312375 A1    Oct. 23, 2014

(30) Foreign Application Priority Data

Apr. 23, 2013   (DE) .......................... 10 2013 207 308

(51) Int. Cl.
| | |
|---|---|
| H01L 33/60 | (2010.01) |
| H01L 33/50 | (2010.01) |
| H01L 23/00 | (2006.01) |
| H01L 33/54 | (2010.01) |
| H01L 33/56 | (2010.01) |

(52) U.S. Cl.
CPC ......... *H01L 33/50* (2013.01); *H01L 2924/0002* (2013.01); *H01L 24/97* (2013.01); *H01L 2224/48091* (2013.01); *H01L 2224/8592* (2013.01); *H01L 33/505* (2013.01); *H01L 33/508* (2013.01); *H01L 33/54* (2013.01); *H01L 33/56* (2013.01); *H01L 2933/0041* (2013.01); *H01L 2933/005* (2013.01)

(58) Field of Classification Search
CPC ......... H01L 33/08; H01L 33/20; H01L 33/68; H01L 33/483
USPC .................. 438/27–32; 257/89–99, E33.067, 257/21.499
See application file for complete search history.

(56) References Cited

U.S. PATENT DOCUMENTS

| | | | |
|---|---|---|---|
| 8,547,502 B2 * | 10/2013 | Nakazato et al. | 349/69 |
| 2006/0022214 A1 * | 2/2006 | Morgan et al. | 257/99 |
| 2009/0103005 A1 * | 4/2009 | Nakazato et al. | 349/62 |
| 2011/0006316 A1 * | 1/2011 | Ing et al. | 257/89 |

(Continued)

FOREIGN PATENT DOCUMENTS

| | | |
|---|---|---|
| DE | 102 45 946 | 10/2003 |
| DE | 10 2005 010 311 | 9/2006 |

(Continued)

*Primary Examiner* — Michael Lebentritt
(74) *Attorney, Agent, or Firm* — DLA Piper LLP (US)

(57) ABSTRACT

A method for producing an optoelectronic assembly (12) is provided, in which an optoelectronic component (16) is arranged on a carrier (14). Electrical terminals of the optoelectronic component (16) are electrically coupled to electrical contacts of the carrier (14) corresponding thereto. A dummy body (20) is arranged on a first side of the optoelectronic component (16) facing away from the carrier (14). A potting material (22) is arranged on the carrier (14), which potting material at least partially encloses the optoelectronic component (16) and at least partially encloses the dummy body (20). The dummy body (20) is removed, after the potting material (22) is dimensionally stable, whereby a recess (23) results, which is at least partially enclosed by the dimensionally stable potting material (22). An optically functional material (24) is decanted into the recess (23).

15 Claims, 4 Drawing Sheets

(56) References Cited

U.S. PATENT DOCUMENTS

Figure 1:
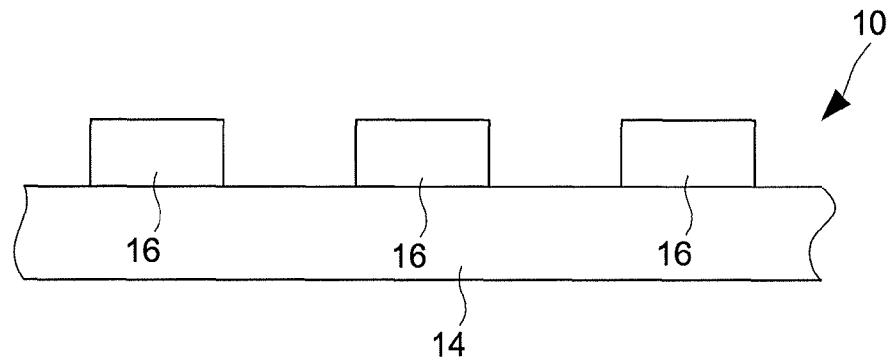

| | | |
|---|---|---|
| 2011/0241048 A1 | 10/2011 | Taguchi |
| 2012/0097986 A1 | 4/2012 | Ku |
| 2014/0167077 A1* | 6/2014 | Chen et al. .................... 257/88 |

FOREIGN PATENT DOCUMENTS

| | | |
|---|---|---|
| KR | 10 2012 0040901 | 4/2012 |
| WO | 2010/085480 | 7/2010 |

* cited by examiner

METHOD FOR PRODUCING AN OPTOELECTRONIC ASSEMBLY AND OPTOELECTRONIC ASSEMBLY

TECHNICAL AREA

This disclosure relates to a method for producing an optoelectronic assembly and to an optoelectronic assembly.

This patent application claims the priority of German patent application DE 10 2013 207 308.9, the content of the disclosure of which is hereby incorporated by reference.

PRIOR ART

Currently, energy-efficient and high-intensity light sources such as LEDs (light-emitting diode) or lasers, usually in the form of laser diodes, are increasingly being used in modern illumination devices. In contrast to incandescent bulbs, which are thermal radiators, these light sources emit light in a narrowly limited spectral range, so that their light is nearly monochromatic or is exactly monochromatic. One possibility for opening up further spectral ranges consists, for example, of light conversion, in which phosphors are irradiated by means of LEDs and/or laser diodes and in turn emit light of another wavelength. For example, a layer having a phosphor can be illuminated by means of LEDs or laser diodes and in turn emits light of another color, i.e., another wavelength. For example, this technology can be used to convert light of blue LEDs into white light by admixing yellow light, which is generated by exciting a phosphor-containing layer.

For some applications, thin phosphor layers such as cubic silicate minerals, orthosilicates, garnets, or nitrides are applied to surfaces of corresponding carriers. The phosphor layers are mechanically fixed in this case using binders, for example, and bound to an optical system (lenses, collimators, etc.), wherein the light coupling can occur via air or by means of an immersion medium, for example.

In the above-mentioned applications, the phosphors are typically excited to emission by means of LEDs and/or laser diodes having high light outputs. The thermal losses arising in this case are to be dissipated, for example, via the LED and/or a carrier of the LED, to avoid overheating and therefore thermally related changes of the optical properties or also the destruction of the phosphor.

The phosphors, which are usually provided in powdered form, do not form mechanically stable layers, i.e., abrasion-proof and/or scratch-proof layers, without an additional use of binders, for example, silicones. Binders are also generally used, however, to bring together the phosphor particles into a phase which can then be applied to corresponding surfaces. If binders are used for layer stabilization, these binders can themselves interact with the phosphors and therefore influence their optical and thermal properties, and also their service life. In addition, the thermal conductivity of the binders frequently represents a limiting variable in the dissipation of heat arising in a conversion component having phosphor layer.

As alternatives, conversion components are known, which are formed from a ceramic comprising the phosphor or from a crystal comprising the phosphor. In particular, the phosphor can form the ceramic or the crystal, respectively. Such conversion components can be fixedly glued onto cooling bodies, so that the heat arising therein can be dissipated. A limiting variable for the dissipation of the heat in this case is the thermal conductivity of the adhesive used. Furthermore, it is favorable for good heat dissipation if the conversion components are implemented as particularly thin. A limiting variable for the thickness of the conversion component is the stability of the conversion component, which disappears with disappearing thickness, however, and the required ability to handle the conversion component upon application to the cooling body. This can result in a high discard rate during the production process in the case of very thin conversion components.

Furthermore, conversion components having phosphors are arranged on active regions of LED chips and the LED chips and the conversion components are embedded in the lateral direction in white and/or highly reflective material. To optimize the light yield by means of embedding of LED chips having chip-proximal conversion layers, for example, in white material, the conversion layer or transparent layer has heretofore been applied to the LED chip, before the system of LED chip/conversion layers is embedded in the white material. The conversion layers must fulfill specific conditions in this case, to allow an optimum connection between conversion layer and the white potting compound introduced later. Therefore, one is restricted to specific conversion layers, which can only be manufactured using specific production methods, and other conversion layers are excluded from use. The achievable colors and/or color temperatures are therefore also restricted to specific ranges.

SUMMARY

A method for producing an optoelectronic assembly is provided, wherein
an optoelectronic component is arranged on a carrier and electrical terminals of the optoelectronic component are electrically coupled to electrical contacts of the carrier corresponding thereto,
a dummy body is arranged on a first side of the optoelectronic component facing away from the carrier,
a potting material is arranged on the carrier, which potting material at least partially encloses the optoelectronic component and at least partially encloses the dummy body,
the dummy body, after the potting material is dimensionally stable, is removed, whereby a recess results, which is at least partially enclosed by the dimensionally-stable potting material,
an optically functional material is decanted into the recess.
In addition, an optoelectronic assembly is provided, which is produced with the aid of the method according to one of the preceding claims.

IN THE FIGURES

Figure 2:
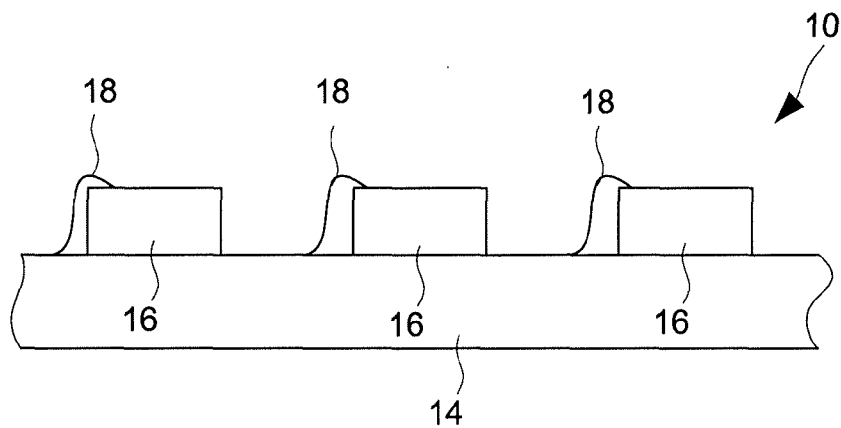
Figure 3:
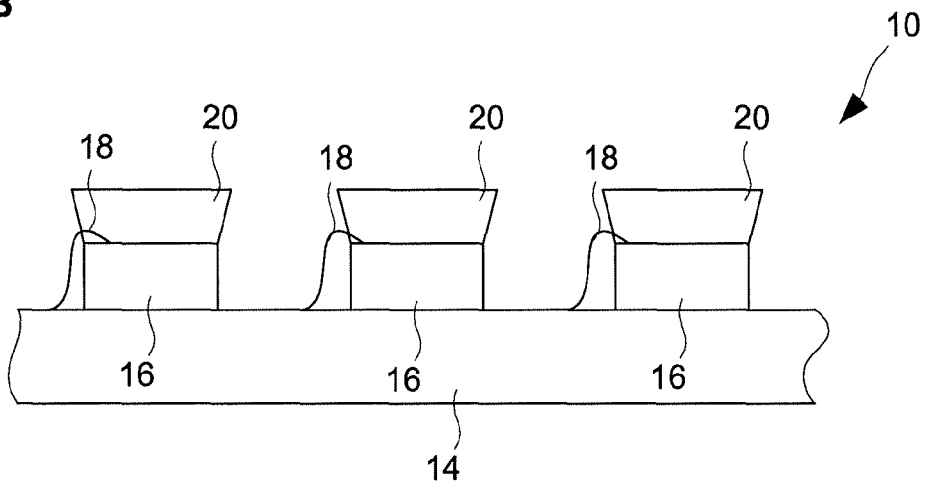
Figure 4:
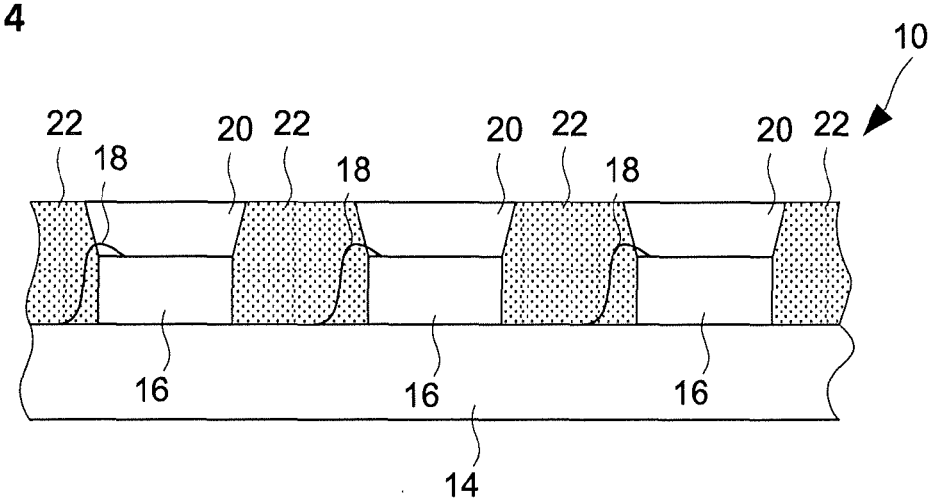
Figure 5:
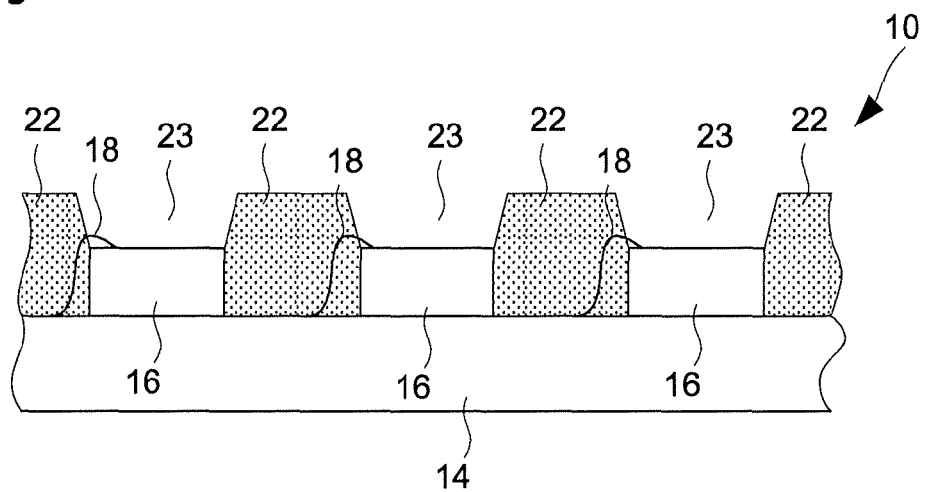
Figure 6:
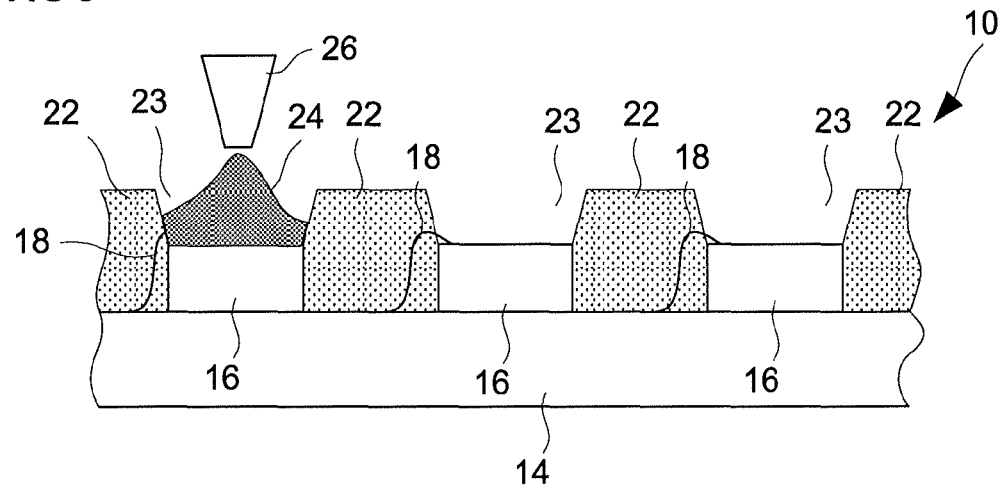
Figure 7:
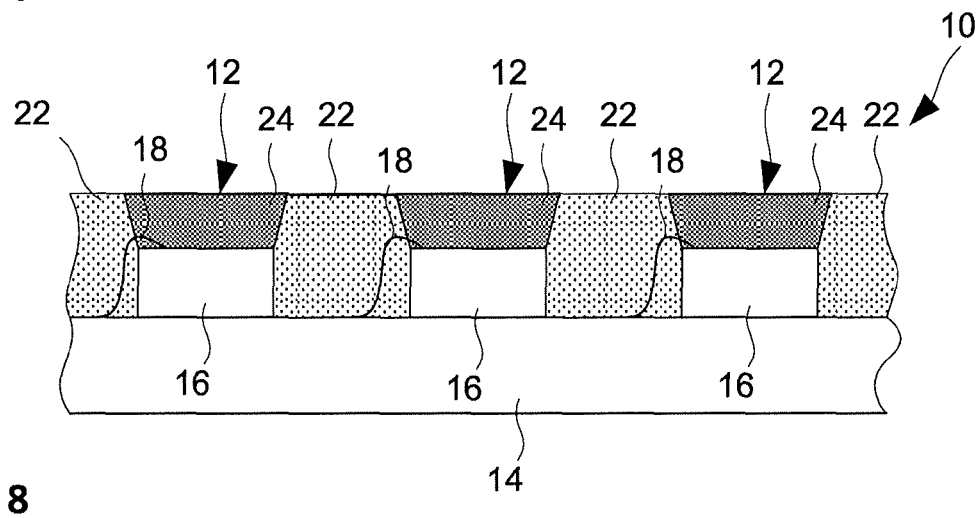
Figure 8:
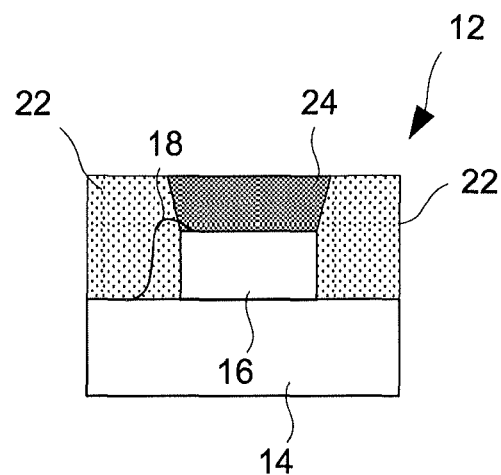
Figure 9:
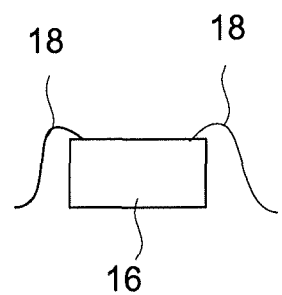
Figure 10:
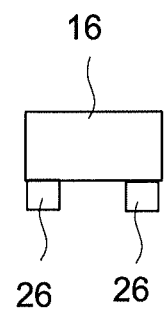
Figure 11:
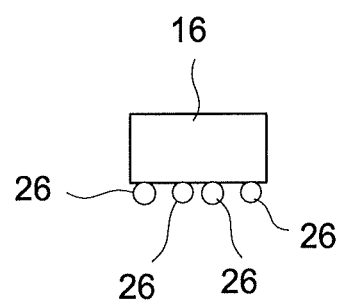

FIG. 1 shows a first step of a method for producing an optoelectronic assembly;
FIG. 2 shows a second step of the method for producing the optoelectronic assembly;
FIG. 3 shows a third step of the method for producing the optoelectronic assembly;
FIG. 4 shows a fourth step of the method for producing the optoelectronic assembly;
FIG. 5 shows a fifth step of the method for producing the optoelectronic assembly;
FIG. 6 shows a sixth step of the method for producing the optoelectronic assembly;
FIG. 7 shows a seventh step of the method for producing the optoelectronic assembly;
FIG. 8 shows an optoelectronic assembly;
FIG. 9 shows an optoelectronic component;
FIG. 10 shows an optoelectronic component;

FIG. 11 shows an optoelectronic component.

In the following detailed description, reference is made to the appended drawings, which form part of this description and in which specific exemplary embodiments are shown for illustration. In this regard, direction terminology such as "top", "bottom", "forward", "back", "front", "rear", etc. is used with reference to the orientation of the described figure(s). Since components of exemplary embodiments can be positioned in a number of different orientations, the direction terminology is used for illustration and is in no way restrictive. It is obvious that other exemplary embodiments can be used and structural or logical changes can be performed without deviating from the scope of protection. It is obvious that the features of the different exemplary embodiments described herein can be combined with one another, if not specifically indicated otherwise. The following detailed description is therefore not to be interpreted in a restrictive sense, and the scope of protection is defined by the appended claims.

In the scope of this description, the terms "connected", "attached", and also "coupled" are used to describe both a direct and also an indirect connection, a direct or indirect attachment, and also a direct or indirect coupling. In the figures, identical or similar components are provided with identical reference signs, insofar as this is expedient.

An optoelectronic assembly can have an optoelectronic component and an optically functional material. Optionally, an optoelectronic assembly can also have two or more optoelectronic components and corresponding optically functional materials. An optoelectronic component can preferably be a component which emits electromagnetic radiation or a component which absorbs electromagnetic radiation. A component which absorbs electromagnetic radiation can be a solar cell, for example. A component which emits electromagnetic radiation can be implemented, for example, as a semiconductor component which emits electromagnetic radiation and/or as a diode which emits electromagnetic radiation, as an organic diode which emits electromagnetic radiation, as a transistor which emits electromagnetic radiation, or as an organic transistor which emits electromagnetic radiation. The radiation can be light in the visible range, UV light, and/or infrared light, for example. In this context, the component which emits electromagnetic radiation can be implemented, for example, as a light-emitting diode (LED), as an organic light-emitting diode (OLED), as a light-emitting transistor, or as an organic light-emitting transistor. The light-emitting component can preferably be part of an integrated circuit. Furthermore, a plurality of light-emitting components can be provided, for example, housed in a shared housing.

In various exemplary embodiments, an optically functional material can be understood as a material which influences electromagnetic radiation. For example, the optically functional material can have a conversion material, with the aid of which electromagnetic radiation can be converted with respect to its wavelength. The conversion material can have one, two, or more phosphors, for example. Alternatively or additionally, the optically functional material can have a specific index of refraction, for example, to keep an index of refraction jump from the optoelectronic component to the ambient air small, for example, so that an efficiency of the optoelectronic assembly is high.

Typical phosphors are, for example, garnets or nitrides, silicates, nitrides, oxides, phosphates, borates, oxynitrides, sulfides, selenides, aluminates, tungstates, and halides of aluminum, silicon, magnesium, calcium, barium, strontium, zinc, cadmium, manganese, indium, tungsten, and other transition metals, or rare earth metals such as yttrium, gadolinium, or lanthanum, which are doped with an activator, for example, copper, silver, aluminum, manganese, zinc, tin, lead, cerium, terbium, titanium, antimony, or europium. In various embodiments, the phosphor is an oxidic or (oxy) nitridic phosphor, such as a garnet, orthosilicate, nitrido-(alumino)-silicate, nitride, or nitrido-orthosilicate, or a halogenide or halophosphate. Specific examples of suitable phosphors are strontium chloroapatite:Eu ($(Sr,Ca)_5(PO_4)_3Cl$:Eu; SCAP), yttrium-aluminum garnet:Cer (YAG:Ce), or $CaAlSiN_3$:Eu. Furthermore, particles having light-scattering properties and/or auxiliary substances, for example, can be contained in the phosphor or phosphor mixture. Examples of auxiliary substances include surfactants and organic solvents. Examples of light-scattering particles are gold, silver, and metal oxide particles.

FIG. 1 shows an example of a first step of a method for producing an optoelectronic assembly. In the first step, a carrier 14 is provided and/or implemented. Multiple optoelectronic components 16 are arranged on the carrier 14. The optoelectronic components 16 are arranged above the carrier 14. The carrier 14 and the optoelectronic components 16 form an assembly composite 10.

The carrier 14 extends over the entire assembly composite 10. The carrier 14 can have, for example, ceramic, metal, plastic, resin, and/or a semiconductor material. The carrier 14 can be implemented, for example, as a lead frame, printed circuit board, or substrate. The carrier 14 can have conductor paths (not shown) for transporting and/or conducting electrical current and/or electrical contacts, for example, contact pads, which are connected to the conductor paths.

Before the arrangement of the optoelectronic components 16, layers (not shown) can be implemented on the carrier 14, for example, during the implementation of the carrier 14. For example, the carrier 14 can optionally be coated with one, two, or more further layers, for example, with a metal layer, a reflective layer, an antireflective layer, and/or an insulator layer. In addition, the optoelectronic components 16 can be connected to the carrier 14 with the aid of adhesive agents, for example, with the aid of adhesive or solder, wherein the corresponding adhesive agent can form an adhesive agent layer between the carrier 14 and the corresponding optoelectronic component 16.

The optoelectronic components 16 each have an active region on the first sides thereof. In the case of a component which emits electromagnetic radiation, the active region is, for example, a region which emits electromagnetic radiation, for example, a radiation exit surface, and, in the case of a component which absorbs electromagnetic radiation, it is, for example, a radiation-sensitive region.

FIG. 2 shows an example of a second step of the method for producing the optoelectronic assembly. The optoelectronic components 16 are electrically coupled to the carrier 14 in this second step. The optoelectronic components 16 each have, for example, one, two, or more electronic terminals on a first side of the optoelectronic components 16 facing away from the carrier 14. The electrical terminals of the optoelectronic components 16 are electrically coupled to electrical contacts of the carrier 14 corresponding thereto.

Subsequently, at least one bond wire 18 accordingly extends from the first side of the corresponding optoelectronic component 16 to the carrier 14 for each optoelectronic component 16. The bond wires 18 can be electrically and mechanically coupled to the electrical terminals of the optoelectronic components 16 and/or the electrical contacts of the carrier 14 by means of a solder connection.

Alternatively thereto, the optoelectronic components 16 can also have their electrical terminals on second sides of the optoelectronic components, facing toward the carrier, and/or on side walls of the optoelectronic components 16, which connect the first and the second sides. Furthermore, alternatively, the optoelectronic components 16 can be arranged on the carrier 14 and coupled thereto in a single step, for example, for the case in which the optoelectronic components 16 have their electrical terminals on their second side or on their side walls, the optoelectronic components 16 can be electrically and mechanically coupled via the electrical terminals to the carrier 14. In other words, the first and the second steps of the method for producing the optoelectronic assembly can be carried out simultaneously.

FIG. 3 shows an example of a third step of the method for producing the optoelectronic assembly. In this step, one dummy body 20 is arranged on each of the optoelectronic components 16. The dummy bodies 20 each have a first side of the dummy body 20 facing away from the optoelectronic component 16 and a second side of the dummy body 20 facing toward the optoelectronic component 16. The dummy bodies 20 furthermore have side walls, which connect the first side of the dummy body 20 to the second side of the dummy body 20.

The dummy bodies 20 are preferably implemented in the form of truncated pyramids. The first and the second sides of the dummy bodies 20 each form a square surface. The square surfaces of the second sides of the dummy bodies 20 are smaller than the square surfaces of the first sides of the dummy bodies 20. The side walls form trapezoidal surfaces. The dummy bodies 20 can have, for example, metal, ceramic, and/or silicone, also, for example, resin, for example, epoxy resin.

The dummy bodies 20 are implemented and arranged so that they at least partially cover the active regions of the optoelectronic components 16. For example, the dummy bodies 20 are implemented and arranged so that they completely cover the active regions of the optoelectronic components 16. For example, the dummy bodies 20 are implemented and arranged so that they completely cover the first sides of the optoelectronic components 16, wherein the electrical terminals of the optoelectronic components 16 on the first sides of the optoelectronic component 16 can be covered or not covered by the dummy bodies 20.

Optionally, the dummy bodies 20, in particular the side walls and/or the second sides of the dummy bodies 20, which face toward the optoelectronic component 16, can be implemented or coated so that they do not adhere to a subsequently adjoining potting material and/or they do not adhere to the surface of the optoelectronic component 16. For example, the dummy bodies 20 can have anti-adhesive layers for this purpose on the side walls and/or the second sides of the dummy bodies 20. The anti-adhesive layers can be implemented so that no adhesion or only negligible adhesion results from the beginning. Alternatively thereto, the adhesion can initially result, but can then be detached easily. For example, the anti-adhesive layers can be composed so that irradiation with UV light disengages the connection between the dummy body 20 and the optoelectronic component 16 and/or the potting material. Subsequently, the dummy body 20 can be removed, for example, by means of vacuum tweezers.

FIG. 4 shows an example of a fourth step of the method for producing the optoelectronic assembly. In the fourth step, a potting material 22 is arranged between the optoelectronic components 16 and the corresponding dummy bodies 20 and on the carrier 14. The potting material 22 can be introduced, for example, in the liquid or viscous state between the optoelectronic components 16 and the dummy bodies 20 and applied to the carrier 14. The potting material 22 can be applied, for example, so that upper edges of the dummy bodies 20 shown in FIG. 4 are flush with a surface of the potting material 22. Alternatively thereto, the potting material 22 can be applied, for example, so that the surface of the potting material 22 lies below the upper edges of the dummy bodies 20 in FIG. 4, so that the potting material 22 does not flow onto the dummy bodies 20, but rather is only arranged between them. The potting material 22 can be applied to the carrier 14 in a dispensing method, for example. The potting material 22 can have, for example, silicone or resin, for example, artificial resin. The potting material 22 can have, for example, a carrier material, for example, the silicone or the resin, and particles embedded therein. The particles can be implemented as white and/or highly-reflective, for example. The particles can have, for example, $SiO_2$ and/or cristobalite.

The potting material 22 can subsequently be solidified, for example, cured and/or dried. For example, the potting material 22 can be solidified such that it is dimensionally stable and/or no longer free-flowing.

FIG. 5 shows an example of a fifth step of the method for producing the optoelectronic assembly. In the fifth step, the dummy bodies 20 are removed. Since the potting material 22 is dimensionally stable, recesses 23, which are delimited in the lateral direction by the potting material 22, are formed at the points at which the dummy bodies 22 were arranged. The recesses 23 form negative shapes to the dummy bodies 20. The lateral direction refers in this description to a direction which is parallel to the surface of the carrier 14, on which the optoelectronic components 16 are arranged.

FIG. 6 shows an example of a sixth step of the method for producing the optoelectronic assembly. In the sixth step, an optically functional material 24 is decanted into the recesses 23. The optically functional material 24 can be decanted into the recesses 23 in the liquid or viscous state, for example. The optically functional material 24 can be decanted into the recesses 23 in a dispensing method with the aid of a dispensing head 26, for example. The optically functional material 24 can be a conversion material, for example, and can have one, two, or multiple phosphors or phosphor mixtures. Alternatively or additionally, the optically functional material 24 can have a predefined index of refraction, for example, a particularly high index of refraction. The optically functional material 24 can be selected, for example, so that an index of refraction difference between a surface layer of the optoelectronic component 16 on the first side of the optoelectronic component 16 and the optically functional material 24 is particularly small.

The filling of the recesses 23 with the optically functional material 24 causes the first sides of the optoelectronic components 16 to be completely covered with the optically functional material 24, and the optically functional material 24 to adjoin the potting material 22 continuously and/or without gaps, for example, also over a long service life of the optoelectronic assembly.

FIG. 7 shows an example of a seventh step of the method for producing the optoelectronic assembly. In the seventh step, the optically functional material 24 is decanted into each of the recesses 23. For example, the recesses 23 can be completely filled with the optically functional material 24. Alternatively thereto, the sixth and the seventh steps can be carried out simultaneously. For example, multiple recesses 23 can be filled simultaneously.

A top side of the assembly composite 10, which faces away from the carrier 14, can be implemented as level, wherein the top sides of the optically functional material 24 facing away from the carrier 14 are flush with the top sides of the potting material 22. Alternatively thereto, the recesses 23 can be filled only partially with the optically functional material 24, so that in FIG. 7, the top sides of the optically functional material 24 lie below the upper edges of the potting material 22, and the optically functional material does not flow onto the potting material 22.

Optionally, the optoelectronic components 16 in the assembly composite 10 can be tested and/or measured, and the recesses 23 can be filled more or less depending on the test or measurement results. For example, a phosphor quantity and/or phosphor density in the carrier material of the optically functional material 24 and/or an index of refraction of the optically functional material 24 can be ascertained as a function of the test or measurement results and the optionally functional material 24 can accordingly be decanted individually by component into the recesses 23.

Optionally, the carrier material of the optically functional material 24 can be selected so that the phosphors in the carrier material settle on the first sides of the optoelectronic components 16 and/or sediment thereon, so that the phosphor density is greater close to the optoelectronic components 16 than remote from the optoelectronic components 16. This causes the conversion of the electromagnetic radiation to occur substantially close to the corresponding optoelectronic components 16 and the heat arising in this case to be able to be dissipated rapidly via the corresponding optoelectronic components 16.

FIG. 8 shows an example of optoelectronic component 12, which can be implemented according to the above-explained method, for example. The optoelectronic component 12 can be isolated, for example, in an eighth step of the method for producing the optoelectronic component 12, from the above-explained assembly composite 10, in an isolation process.

FIG. 9 shows an example of an optoelectronic component 16, which can substantially correspond to one of the above-explained optoelectronic components 16, for example, and/or can be used in the above-explained method. The optoelectronic component 16 has two electrical terminals on its first side. The electrical terminals are electrically connected to corresponding bond wires 18, which can be connected to the carrier 14 (not shown in FIG. 9).

FIG. 10 shows an example of an optoelectronic component 16, which can substantially correspond to one of the above-explained optoelectronic components 16 and/or can be used in the above-explained method, for example. The optoelectronic component 16 has two electrical terminals 26 on its second side, which faces toward the carrier 14 during the production of the optoelectronic assembly 12. With the aid of the electrical terminals 26, the optoelectronic component 16 can be electrically coupled directly to the carrier 14, for example, without the use of bond wires and/or, for example, directly during the arrangement of the optoelectronic component 16 on the carrier 14.

FIG. 11 shows an example of an optoelectronic component 16, which can substantially correspond, for example, to one of the above-explained optoelectronic components 16 and/or can be used in the above-explained method. The optoelectronic component has, on its second side, multiple electrical terminals 26, for example, four electrical terminals 26. With the aid of the electrical terminals 26, the optoelectronic component 16 can be electrically coupled directly to the carrier 14, for example, without the use of bond wires and/or, for example, directly during the arrangement of the optoelectronic component 16 on the carrier 14.

The description is not restricted to the specified exemplary embodiments. For example, the dummy bodies 20 and the recesses 23 formed thereby can be shaped differently. For example, the dummy bodies 20 can be implemented as circular, for example, oval or round in the lateral direction, so that recesses 23 having correspondingly circular, oval, or round cross section are formed.

Possible preferred examples are described hereafter: A method for producing an optoelectronic assembly is preferably provided, which can be carried out simply and cost-effectively and/or contributes to a variety of different conversion layers being able to be used in the optoelectronic assembly, and/or which allows the optoelectronic assembly to generate electromagnetic radiation with a particularly high luminance.

An optoelectronic assembly is preferably provided, which is producible simply and cost-effectively and/or in which a variety of different conversion layers can be used and/or which generates electromagnetic radiation having a particularly high luminance.

A method for producing an optoelectronic assembly is preferably provided. In this case, an optoelectronic component is arranged on a carrier. Electrical terminals of the optoelectronic component are electrically coupled to electrical contacts of the carrier corresponding thereto. A dummy body is arranged on a first side of the optoelectronic component facing away from the carrier. A potting material is arranged on the carrier so that the potting material at least partially encloses the optoelectronic component and at least partially encloses the dummy body. The dummy body is removed, after the potting material is dimensionally stable, whereby a recess results, which is at least partially enclosed by the dimensionally-stable potting material. An optically functional material is decanted into the recess.

The optoelectronic component can be, for example, a component which absorbs electromagnetic radiation, for'example, a solar cell, or a component which emits electromagnetic radiation, for example, an LED. The use of the dummy body as a space holder for the optically functional material and the formation of the recess connected thereto and the decanting of the optically functional material into the recess, which can also be referred to as a cavity or mini-cavity, allows, in a simple and cost-effective manner, a variety of different optically functional materials to be able to be used in cooperation with the optoelectronic component.

Furthermore, this method, for example, if the optoelectronic component is an LED, can contribute to the luminance being particularly high or even maximized in the finished optoelectronic assembly, since the light exit surface of the LED is only minimally enlarged during the implementation of the mini-cavity. In addition, if the potting material forms a diffusely scattering white matrix, a waveguide effect can be minimized. Upon the use of phosphors or phosphor combinations in the optically functional material, the selection of possible phosphors or phosphor combinations is substantially unrestricted. For example, if the optoelectronic component is an LED and the optically functional material forms a conversion layer, greatly varying phosphors and phosphor mixtures can thus be used and thus many different colorimetric loci and color temperatures can be achieved. For example, nearly all dispensable resin-phosphor or silicone-phosphor combinations can be used.

As a result of the greater freedom in the material selection, materials may be selected which allow an optimum form fit between the layer formed by the optically functional material on the optoelectronic component, for example, the LED chip, and the matrix enclosing this layer, i.e., the solidified potting material, in particular over a long service life.

Thus, for example, the undesired escape of light, for example, blue light, which has not passed through the conversion layer, can be decreased, minimized, or even prevented. Better color homogeneity can thus be achieved over the emission angle and the service life. Furthermore, very good thermal coupling between the optically functional material and the optoelectronic component can also be achieved with respect to the heat dissipation. In addition, in combination with optical measurement of the parts before application of the phosphor layer, the conversion volume to be introduced can be set, for example, in the case of varying wavelengths of the generated electromagnetic radiation, which result in excitation of phosphors and colorimetric loci thus achieved which differs in strength.

The arrangement of the optoelectronic component on the carrier can also be referred to as "the attach". The electrical coupling of the electrical terminals of the optoelectronic component to the electrical contacts of the carrier corresponding thereto can be performed, for example, by means of wire bonding. The carrier can have ceramic, for example, or can be formed by a metallic lead frame. The dummy body can be formed, for example, by a dummy layer or a dummy lamina, and/or can comprise glass, resin, or silicone. The thickness and/or shape of the dummy body can be embodied as matching to an optoelectronic component to be covered and/or depending on. the optically functional material to be applied later. The decanting of the optically functional material into the recess can be performed by means of dispensing, for example.

In various examples, the potting material is arranged on the substrate so that the potting material completely encloses, in the lateral direction, the optoelectronic component and at least a section of the dummy body facing toward the optoelectronic component. In other words, the optoelectronic component and at least the part of the dummy body coupled thereto are completely embedded in the potting material in the lateral direction. For example, the dummy body can be enclosed in the lateral direction by the potting material up to an upper edge of the dummy body facing away from the optoelectronic component. The lateral direction refers in this description to a direction which is parallel to a surface of the carrier, on which the optoelectronic component is arranged.

The dummy body preferably covers at least one radiation exit surface on the first side of the optoelectronic component.

Furthermore, the dummy body can preferably completely cover the first side of the optoelectronic component.

The dummy body is preferably coated with an anti-adhesive layer at least on the side walls, on which it comes into contact with the optoelectronic component and/or the potting material. For example, the side walls of the dummy body and/or a second side of the dummy body, which is in contact with the first side of the optoelectronic component, are coated and/or treated so that the dummy body can be removed easily.

The anti-adhesive layer is preferably implemented so that it initially adheres to the optoelectronic component and/or the potting material, and this adhesion can be disengaged by means of a predefined treatment. For example, the dummy body and/or its side walls and/or the second side of the dummy body can be composed so that irradiation with UV light disengages the connection between the dummy body and the optoelectronic component and/or the potting material. Alternatively thereto, the dummy body can be temporarily fastened on the optoelectronic component using a water-soluble adhesive agent, for example, wherein the adhesive agent can then be dissolved by means of water. The dummy body can subsequently be removed, for example, by means of vacuum tweezers.

The dummy body is preferably implemented in the form of a truncated pyramid, wherein the dummy body has a first side and a second side of the dummy body facing away from the first side of the dummy body, wherein the first side of the dummy body is larger than the second side of the dummy body and wherein the second side of the dummy body faces toward the first side of the optoelectronic component. The implementation of the dummy body in the form of a truncated pyramid causes the recess to become larger in the direction away from the optoelectronic component.

The dummy body preferably comprises glass, resin, and/or silicone.

The optically functional material preferably comprises a conversion material for converting electromagnetic radiation with respect to its wavelength. This can contribute to very good thermal coupling of the conversion material to the optoelectronic component and therefore to very good dissipation of the heat from the phosphors via the optoelectronic component into the carrier.

The conversion material preferably comprises a carrier material having phosphors embedded therein, which are implemented so that the phosphors settle, in other words sediment, in the carrier material in the recess, so that a concentration of the phosphors in the carrier material is greater close to the optoelectronic component than remote from the optoelectronic component. The conversion of the electromagnetic radiation can thus occur close to the optoelectronic component, whereby the heat arising in operation can be dissipated from the phosphors via the optoelectronic component into the carrier.

The optically functional material preferably has a high index of refraction. For example, InGaAlP can be used as the optically functional material, whereby an efficiency and/or brightness of the optoelectronic assembly can be increased by more than 10%, for example.

The potting material is preferably white. Alternatively or additionally, the potting material can be implemented as reflective, in particular strongly reflective.

The potting material preferably comprises resin, silicone, and/or $TiO_2$, wherein the $TiO_2$ is embedded in the resin or silicone.

The optoelectronic assembly is preferably first produced in an assembly composite, in which a plurality of the assemblies are connected to one another via the carrier, which extends in one piece over the corresponding assemblies. The potting material is arranged between the optoelectronic components and the dummy bodies arranged thereon. After the arrangement of the optically functional material, the optoelectronic assemblies are isolated from the assembly composite.

The invention claimed is:

1. A method for producing an optoelectronic assembly, wherein
    an optoelectronic component is arranged on a carrier and electrical terminals of the optoelectronic component are electrically coupled to electrical contacts of the carrier corresponding thereto,
    a dummy body is arranged on a first side of the optoelectronic component facing away from the carrier,
    a potting material is arranged on the carrier, which potting material at least partially encloses the optoelectronic component and at least partially encloses the dummy body,
    the dummy body, after the potting material is dimensionally stable, is removed, whereby a recess results, which is at least partially enclosed by the dimensionally stable potting material,
    an optically functional material is decanted into the recess.

2. The method as claimed in claim 1, wherein the potting material is arranged on the carrier so that the potting material completely encloses the optoelectronic component and the dummy body in the lateral direction in at least one section of the dummy body facing toward the optoelectronic component.

3. The method as claimed in claim 1, wherein the dummy body covers at least one radiation exit surface on the first side of the optoelectronic component.

4. The method as claimed in claim 3, wherein the dummy body completely covers the first side of the optoelectronic component.

5. The method as claimed in claim 1, wherein the dummy body is coated with an anti-adhesive layer at least on the sides on which it comes into contact with the optoelectronic component and/or the potting material.

6. The method as claimed in claim 5, wherein the anti-adhesive layer is implemented so that it initially adheres to the optoelectronic component and/or the potting material, and this adhesion can be disengaged by means of a predefined treatment.

7. The method as claimed in claim 1, wherein the dummy body is implemented in the form of a truncated pyramid, wherein the dummy body has a first side and a second side of the dummy body facing away from the first side of the dummy body, wherein the first side of the dummy body is larger than the second side of the dummy body, and wherein the second side of the dummy body faces toward the first side of the optoelectronic component.

8. The method as claimed in claim 1, wherein the dummy body comprises glass, resin, and/or silicone.

9. The method as claimed in claim 1, wherein the optically functional material comprises a conversion material for converting electromagnetic radiation with respect to its wavelength.

10. The method as claimed in claim 9, wherein the conversion material comprises a carrier material having phosphors embedded therein, which are implemented so that the phosphors settle in the carrier material in the recess, so that a concentration of the phosphors in the carrier material is greater close to the optoelectronic component than remote from the optoelectronic component.

11. The method as claimed in claim 1, wherein the optically functional material has a high index of refraction.

12. The method as claimed in claim 1, wherein the potting material is white.

13. The method as claimed in claim 1, wherein the potting material comprises resin, silicone, and/or $TiO_2$, wherein the $TiO_2$ is embedded in the resin or silicone.

14. The method as claimed in claim 1, wherein the optoelectronic assembly is first produced in an assembly composite, in which a plurality of the assemblies are connected to one another via the carrier, which extends in one piece over the corresponding assemblies, and wherein the potting material is arranged between the optoelectronic components and the dummy bodies arranged thereon, and wherein after the arrangement of the optically functional material, the optoelectronic assemblies are isolated from the assembly composite (10).

15. An optoelectronic assembly which is produced with the aid of the method as claimed in claim 1.

* * * * *